United States Patent [19]

Jones et al.

[11] Patent Number: 4,927,983
[45] Date of Patent: May 22, 1990

[54] CIRCUIT BOARD

[75] Inventors: Alan L. Jones, Endwell; Keith A. Snyder; Paul E. Winkler, both of Vestal, all of N.Y.

[73] Assignee: International Business Machines Corporation, Armonk, N.Y.

[21] Appl. No.: 286,593

[22] Filed: Dec. 16, 1988

[51] Int. Cl.$^5$ .............................................. H05K 1/00
[52] U.S. Cl. .................................... 174/258; 361/414
[58] Field of Search ....................... 174/68.5; 361/414; 427/97; 29/846

[56] References Cited

U.S. PATENT DOCUMENTS

| | | | |
|---|---|---|---|
| 3,356,786 | 12/1967 | Helms | 174/68.5 |
| 3,471,631 | 10/1969 | Quintana | 361/414 |
| 3,508,330 | 4/1970 | Kubik | 361/414 X |
| 3,895,158 | 7/1975 | Gause et al. | 174/68.5 X |
| 4,179,800 | 12/1979 | Takaba et al. | 29/625 |
| 4,535,388 | 8/1985 | Kraus et al. | 361/414 |
| 4,543,715 | 10/1985 | Iadarola et al. | 174/68.5 X |
| 4,554,405 | 11/1985 | Varker | 174/68.5 |
| 4,581,679 | 4/1986 | Smolley | 361/395 |
| 4,598,166 | 7/1986 | Neese | 174/68.5 |
| 4,827,328 | 5/1989 | Ozawa et al. | 174/68.5 X |

*Primary Examiner*—Morris H. Nimmo

[57] ABSTRACT

An improved circuit board structure and method of forming the same are provided. The circuit board includes an insulating core and has plated through holes connecting the circuitry on both sides and intermediate layers of the core. A permanent dielectric material is applied on at least one surface of the board covering the circuitry and plated through holes. Vias are formed through the dielectric material and signal lines are formed on the top of the dielectric material connected to the circuitry onto the board through the vias. Additional layers of dielectric material with additional wiring and vias can also be formed for multi-level wiring.

7 Claims, 3 Drawing Sheets

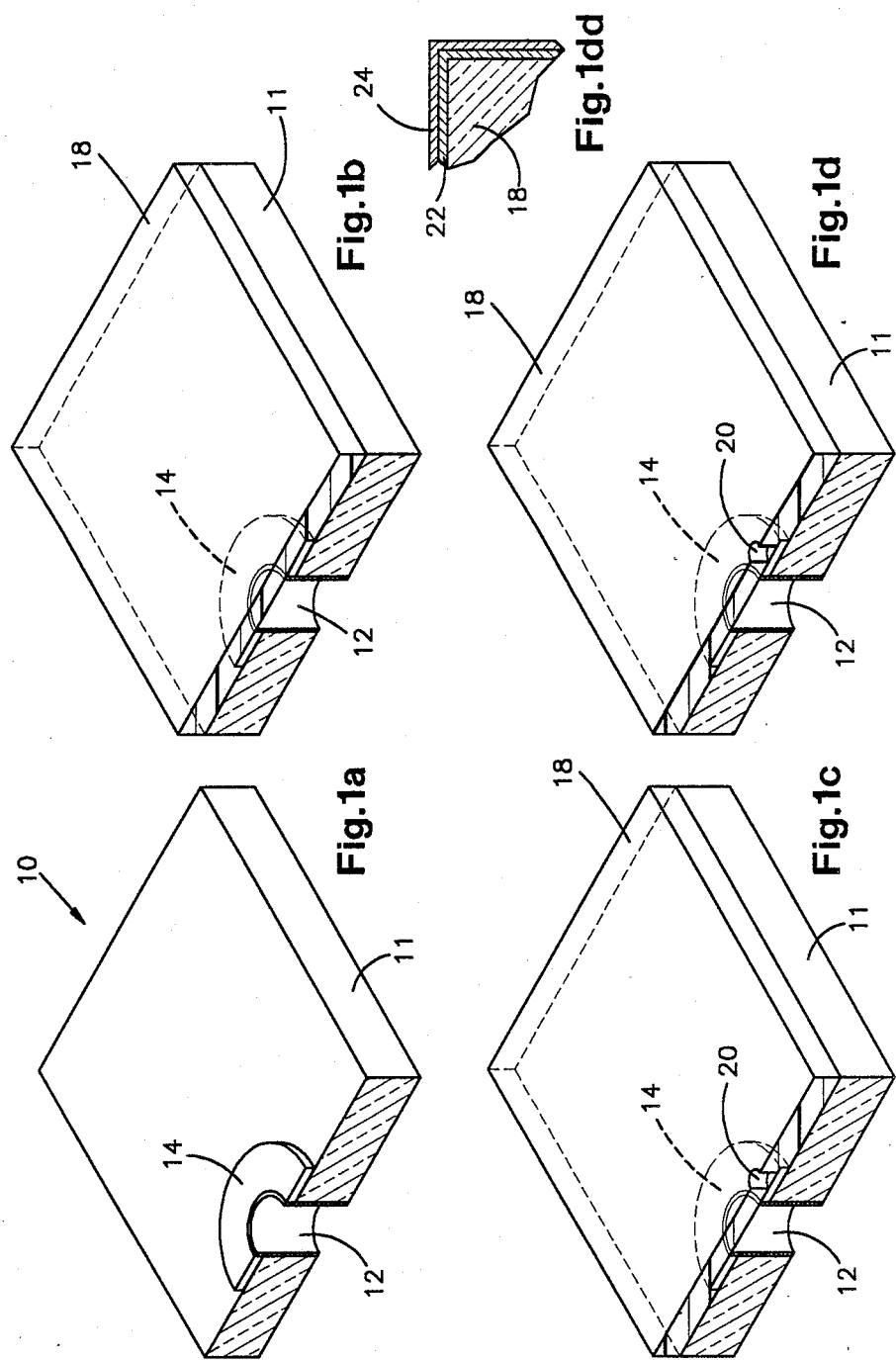

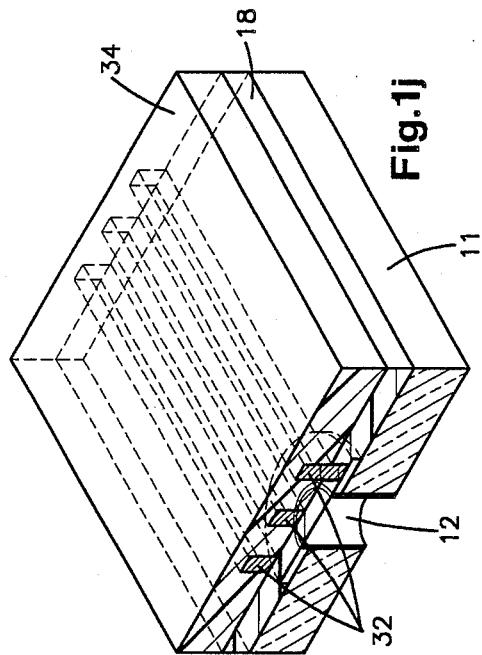
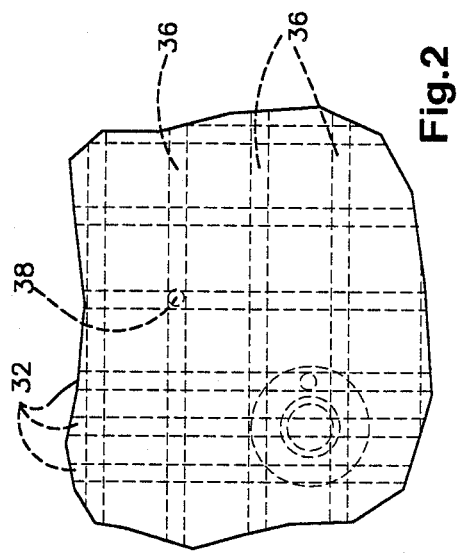
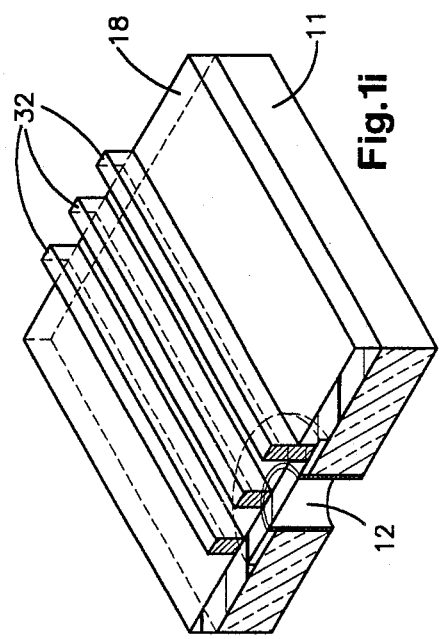
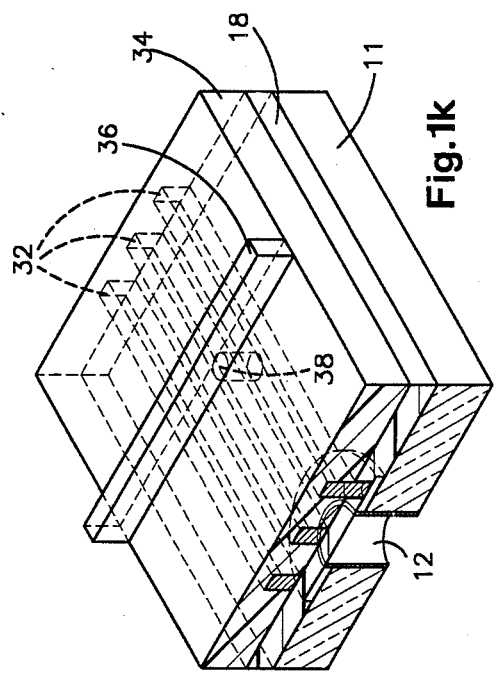

CIRCUIT BOARD

BACKGROUND OF THE INVENTION

1. Field of the Invention

This invention relates generally to printed circuit boards, and more particularly to an improved printed circuit board having plated through holes wherein wiring patterns can be formed over the plated through holes to thereby increase the usable space for printed circuitry. In more specific aspects, the present invention provides a printed circuit board wherein one or more layers of insulating material are applied over the board. The circuit board has plated through holes and each layer of insulating material has formed circuit lines thereon and vias for connection to the next underlying layer of metalization.

2. Prior Art

Conventional printed circuit cards and boards utilize drilled and plated through holes for communication between opposite sides and intermediate layers of the board to the wiring formed on both sides of the board. Frequently, the plated through holes will also receive pins for the connection of various types of circuit components. It is usually required that the plated through holes be able to act as a soldering socket for a module and that requires that they be fairly large and that a solderable ring or land of metal be provided around the plated through holes on the surface of the circuit board so as to allow for soldered connections. This type of structure dictates that a large amount of card or board space cannot be used for point to point wiring since the wiring must be done in the spaced between the holes, leaving room between the individual wire lines and between the wire lines and the solder rings. Recently there has been introduced surface modules and thin film chip wiring devices that do not have pins but have other types of connection pads. With this type of structure the space necessary for the holes can be reduced somewhat; nevertheless even with this technology a significant amount of space is used by the holes which it not available for surface wiring. Various techniques have been suggested for various types of wire interconnection wherein plated through holes are present on the board. For example, U.S. Pat. No. 3,356,786 to Texas Instruments shows a technique where conducting lines can be provided which extend across various openings or holes. This technique, however, has many limitations both in the structures available and the utilization of the holes. Other patents that show techniques for increasing somewhat the wiring density, are U.S. Pat. No. 4,554,405 to International Business Machines Corporation; U.S. Pat. No. 4,581,697 to TRW, Inc.; U.S. Pat. No. 4,535,388 to International Business Machines Corporation; U.S. Pat. No. 4,589,166 to GTE Communication Systems; and U.S. Pat. No. 4,179,800 to DuPont Electric Company. None of these are completely effective to utilize the entire surface area of board.

SUMMARY OF THE INVENTION

According to the present invention an improved circuit board or card and method of making the same is provided. The circuit board or card includes a printed circuit board or card having an insulating core with wiring on both side thereof with or without intermediate layers of wiring and has plated through holes extending from one surface to the other, at least one of which holes is connected to the wiring. A permanent dielectric material is placed on at least one surface of the card or board covering the wiring and the plated through holes. Vias are formed through the dielectric material to communicate with the wiring which is connected to the plated through holes and electrical circuitry or lines that are formed on the dielectric material. At least a portion of the circuitry or lines overlay the plated through holes and are insulated therefrom. The electrical circuitry on the dielectric material is connected to the circuitry on the underlying card through vias formed in the dielectric material. If required, additional layers of dielectric material and electrical circuitry and lines may be formed in a layer fashion in a similar manner and connected to the underlying layer by means of similar vias.

DESCRIPTION OF THE DRAWING

FIGS. 1a through 1k depict various stages in the manufacture of a improved circuit board according to this invention somewhat diagrammatically; and FIG. 2 is a plan view representation of a portion of the circuit board formed according to this invention depicting the various line patterns.

DESCRIPTION OF THE PREFERRED EMBODIMENT

Figure 1E:
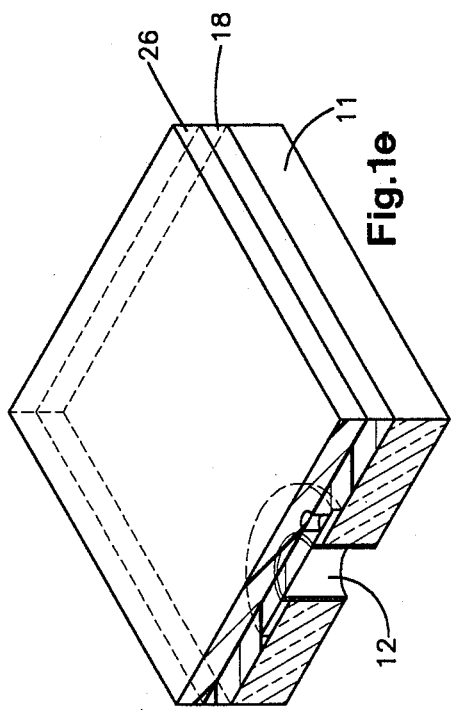
Figure 1F:
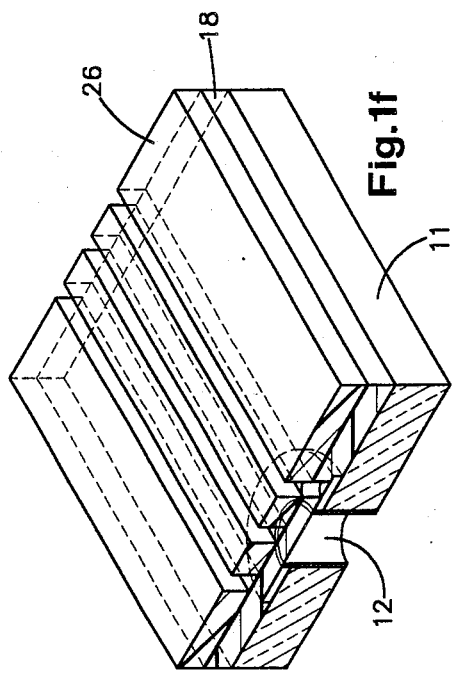

Referring now to the drawings and for the present to FIGS. 1a through 1k the various steps in forming a circuit board according to one embodiment of this invention are depicted somewhat diagrammatically. The starting point for the invention is the provision of a personalized circuit board or card 10. The circuit board 10 includes a core 11 formed preferably of a brominated epoxy resin impregnated in glass cloth which is conventional and well-known in the art. The core 11 has a series of through holes 12 plated with copper or other conducting material to provide electrical conductivity from one side of the core 11 to the other side and to intermediate layers as desired. There is typically provided electrical circuitry on one or both sides of the card which includes solderable rings or lands 14 formed around the plated through holes 12. In many cases copper lines are formed on one or both surfaces of the board in a conventional manner and connect with the solderable rings or lands 14 around each of the plated through holes 12 but these have not been shown for clarity of illustration. These copper lines, if present, serve the purpose of providing electrical connection to the lands from the circuitry which is to be formed as will be described presently. The surface of the circuit board 10 is cleaned by Benzatriazol spray or by Pumice Scrub or by a Vapor Blast to prepare it for the reception of a permanent photoresist. As shown in FIG. 1b, a layer of permanent photoresist 18 is applied to the surface thereof. Preferably this is a dry photoresist which is applied in sheet form. A preferred type of photoresist that which is described in United States Application Serial No. 062,360 Filed June 12, 1987 entitled "Photoresist Composition and Printed Circuit Boards and Packages Made Therewith". A particularly preferred embodiment of this photoresist is a resin comprised of about 78% SUB, a multi-functional epoxy resin sold by Interez Company; about 17% Araldite CY179, A cycloalphatic epoxy resin sold by Ciba Geigy Corporation; and at about 5% Tactix 742 a trifunctional epoxy resin sold by Dow Chemical Company. To this resin, about 5% by weight of UVE 1014, a photo initiator sold by General Electric Company, is added. This is a sheet or dry film type of photoresist and preferably is applied in sheets having a thickness of about 0.002". This can be applied by conventional practices such as hot roll lamination performed at about 100° to 150° C. with a speed of about two feet per minute and 30 psi air assist. It is important that this photoresist must be capable of being able to be cured to a hard impervious relatively non-reactive insulating material capable of remaining in place on the board and having metal circuitry formed thereon; thus, resists having these properties are characterized herein as permanent photoresists. While other photoresists could be used, this particular photoresist is especially desirable and useful for this application.

At this point, the permanent photoresist 18 is exposed in the desired via pattern for providing interconnection through the photoresist layer 18 to the underlying lands 14 or copper lines. The exposure can be done on a conventional Tamarack exposure tool at about 10 psi photo-master contact pressure, at 750 Millijoules per square centimeter, using a 300–500 nanometer arc 5 kw lamp. The resist is then given a preliminary or partial cure by baking it for about 10 minutes at about 100° C. This partial cure is to increase the differential solubility between the exposed and unexposed photoresist for the subsequent developing step but is not a final cure which will be performed later.

The pattern is then developed preferably in a solution of 94% 1,1,1 MCF Trichloromethane and 6% Gamma Butyrolacetone spray for about 60 seconds at about 30–40 psi followed by a water rinse for about 30–45 seconds and a forced air dry. This will provide a structure as shown in FIG. 1c with vias 20 formed through the permanent photoresist 18. Following the development, the remaining photoresist 18 is subjected to a final or permanent cure by exposing it to about 2 joules on the Tamarack exposure tool and then baking at about 150° C. for one-half hour. This provides a firm, impervious, permanent electrically insulating dielectric material suitable for the reception of metal circuitry thereon. The circuitry is applied in the following way.

The surface of the photoresist 18 is cleaned preferably by a vapor blast of pumice and water. Thereafter a metalization seed layer is applied to the surface of the photoresist 18 and in the vias 20. This is perfectly by vacuum metalization of a chrome copper layer in a vacuum chamber and serves as an adhesion layer for subsequent copper plate of the vias and circuitry. First of all a chrome layer 22 is deposited by vacuum evaporation which typically is about 400 to 800 angstroms thick followed by a vacuum deposition of a copper layer 24 about 3,000 angstroms thick. These are both deposited by conventional vacuum deposit techniques which will provide the structure as shown in FIG. 1d and in more detail in FIG. 1dd.

Following this step a film 26 of dry resist is applied which preferably is a negative resist sold under the tradename Riston T-168 by DuPont Company. This typically is about 1½ mils thick and is applied by hot roll laminator in a conventional manner. This point in the process is shown in FIG. 1e. The dry fil resist 26 is then patterned by exposure to ultraviolet light radiation preferably by using a Tamarack contact exposure tool, the exposure being from about 2–5 seconds at about 60–70 millijoules. The pattern exposed is a negative of the pattern that is desired for the metal line pattern to be applied onto the permanent photoresist 18. The photoresist 26 is also exposed above the location of the lands 14 or other interlayer circuit contact point to which the material lines are to be connected. The pattern is then developed in a conventional manner such as by utilizing a methylchloroform spray followed by a rinse utilizing water spray or freon. This is conventional practice and provides the structure shown in FIG. 1f.

Figure 1G:
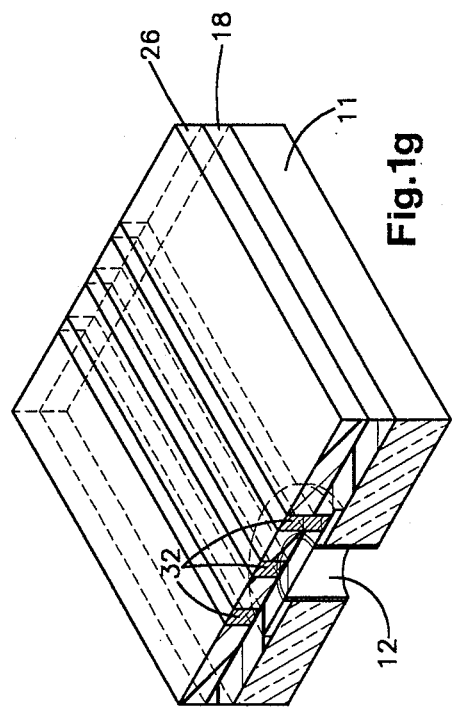

Copper is then plated preferably from an acid electroplating bath typically a copper sulfate in aqueous sulfuric acid. The electroplating provides a copper deposit over the previously seeded layer within the pattern which will become copper lines 32 and copper is deposited into the vias 20. This structure is shown in FIG. 1g.

Figure 1H:
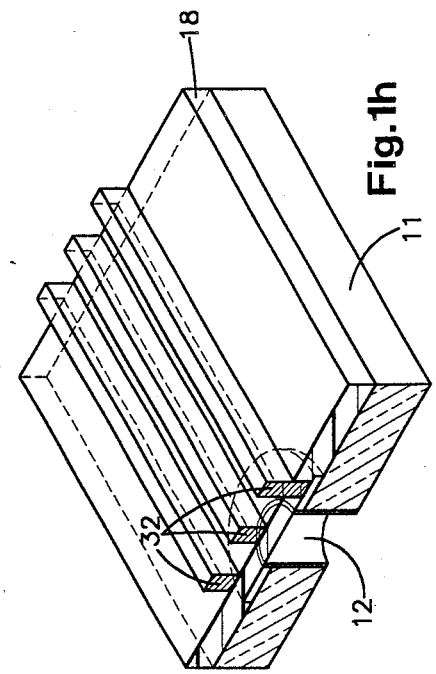

The previously exposed dry film photoresist 26 is then stripped utilizing a methylene chloride spray at about 18 psi followed by a water spray rinse and air dry. This will remove the exposed dry film resist 26 and allow the copper lines 32 deposited onto the seed layer of chrome 22 and copper 24 and the plated filled vias 20 to remain as shown in FIG. 1h.

At this point the remaining chrome and copper seed layer 22 and 24 is flash etch stripped. The copper preferably is removed with a ferric chloride solution of about 1.28 specific gravity sprayed at about 30° C. for about one minute at a pressure of about 8 psi to reveal the underlying chrome. The chrome is then removed with potassium permanganate composition containing about 60 grams per liter of sodium hydroxide sprayed about 30° C. for about 1.2 minutes at a spray pressure of about 8 psi followed by a rinse in deionized water. The entire structure can then be followed by two deionized water rinses. The resulting structure is shown in FIG. 1i.

As can be seen in FIG. 1i, the copper lines 32 can be placed very close together and can actually pass directly over underlying plated through holes 12 allowing for a very close pattern of wiring on the surface of the permanent photoresist 18. Where connections are required, the filled vias 20 provide electrical continuity from the wiring or copper signal lines 32 to the underlying lands 14 (or lines if present) and hence to the plated through holes 12. A similar structure can be provided on the opposite side of the circuit board 10.

If it is desired to place additional wires and particularly if it is desired to have wires running in a direction orthogonal to the copper lines 32 on the photoresist 18, the entire procedure can be repeated to provide an additional layer of lines. In this case a second layer of permanent photo resist 34 which is the same as the photo resist 18, is applied over the copper lines 32 and the layer photo resist 18 as shown in FIG. 1j. The identical process as described above is then repeated to provide a second set of copper lines one of which is shown at 36 on top of the layer 34 of the permanent photo resist preferably running orthagonally to the copper lines 32 all as shown in FIG. 1k. Vias 38 are formed in the second layer 34 of permanent photo resist to provide for interconnection of the copper lines 36 to the copper lines 32. Again, the copper lines 34 can be very closely spaced and can pass over the underlying plated through holes 12 on the circuit board 10.

FIG. 2 shows a Plan view, somewhat diagrammatic, of certain of the lines, vias, and plated through holes indicating how the dense wiring is achieved. Indeed wiring density can be significantly greater than that which can be achieved on the underlying board due to the requirement of not being able to run the lines directly on the board over the holes. Indeed lines as small as 2 mils wide and on 4 mils center can be employed in this invention; whereas, in the prior art when the lines are on the circuit board, the lines very often will have to be 4 mil lines on 9 mil centers to avoid the plated through holes.

The preferred embodiment of the invention utilizes a permanent photoresist and photo lithographic techniques to provide the vias in the permanent photoresists 18 and 34. However, it is possible to utilize permanent dielectric materials other than photoresists. One specific material is polytetrafluoroethylene. In this case, rather than exposing and developing the dielectric layer to provide the vias 20 and 38, mechanical or laser drilling techniques are utilized to provide the vias 18 and 38 at the desired locations. Otherwise the technique of forming the lines and filling the vias with metal are the same as described previously.

While several embodiments of the present invention have been shown and described, various adaptations and modifications can be made without departing from the scope of the invention as defined in the appended claims.

What is claimed is:

1. An improved printed circuit board which board comprises an insulating core having plated through holes;
    electrical circuitry on at least one side thereof which circuitry includes lands connected to said plated through holes;
    a permanent dielectric material on said at least one side of said board covering the circuitry and the plated through holes,
    vias extending through said permanent dielectric material to communicate with circuitry connected to said plated through holes;
    electrical circuit lines on said permanent dielectric material at least a portion of which circuit lines overlies said plated through holes and is insulated therefrom;
    said vias connecting said electrical circuit lines to said circuitry on said core.

2. The invention as defined in claim 1 wherein said dielectric material is a photoresist material and said vias are formed by photolithography.

3. The invention defined in claim 1 further characterized by a second layer of permanent dielectric material overlying the circuit liens and the top surface of said first dielectric material, circuit lines disposed on said second layer of dielectric material;
    at least a portion of said second circuit lines on said second layer of dielectric material being connected to the first circuit lines on the first layer of dielectric material through vias formed in said second layer of dielectric material.

4. The invention as defined in claim 3 wherein the first circuit lines and the second circuit lines each include a series of parallel signal lines and wherein the second circuit lines are generally orthogonal to said first circuit lines.

5. The invention as defined in claim 1 wherein said dielectric material is polytetrafluoroethylene and the vias therein are formed by removing by mechanical or laser means portions of dielectric material.

6. The invention as defined in claim 2 wherein said photoresist material is an epoxy resin having a photoinitiator contained therein.

7. The invention as defined in claim 6 wherein said resin includes a multi-function epoxy resin component, a cycloaliphatic epoxy resin component, and a trifunctional epoxy resin component.

* * * * *